(12) United States Patent
Kaeriyama (10) Patent No.: US 10,374,594 B2
(45) Date of Patent: Aug. 6, 2019

(54) SEMICONDUCTOR DEVICE

(71) Applicant: Renesas Electronics Corporation, Tokyo (JP)

(72) Inventor: Shunichi Kaeriyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 7 days.

(21) Appl. No.: 15/649,824

(22) Filed: Jul. 14, 2017

(65) Prior Publication Data

US 2017/0317669 A1   Nov. 2, 2017

Related U.S. Application Data

(63) Continuation of application No. 14/856,059, filed on Sep. 16, 2015, now Pat. No. 9,712,149.

(30) Foreign Application Priority Data

Sep. 19, 2014   (JP) ................................. 2014-190819

(51) Int. Cl.
*H03K 17/60* (2006.01)
*H03K 17/082* (2006.01)
*H03K 17/08* (2006.01)

(52) U.S. Cl.
CPC . *H03K 17/0828* (2013.01); *H03K 2017/0806* (2013.01)

(58) Field of Classification Search
CPC ....... H03K 19/00315; H03K 19/00361; H03K 17/04126; H03K 17/063; H03K 17/567;

(Continued)

(56) References Cited

U.S. PATENT DOCUMENTS 7,242,238 B2 * 7/2007 Higashi .............. H03K 17/0828
  327/374
7,554,181 B2   6/2009 Satou et al.
(Continued)

FOREIGN PATENT DOCUMENTS

JP   11-299218 A    10/1999
JP   2003-202355 A   7/2003
(Continued)

OTHER PUBLICATIONS

Communication dated Mar. 13, 2018, from Japanese Patent Office in counterpart application No. 2014-190819.
(Continued)

*Primary Examiner* — Long Nguyen
(74) *Attorney, Agent, or Firm* — McDermott Will & Emery LLP (57) ABSTRACT

The semiconductor device according to one embodiment includes a power transistor and a sense transistor connected in parallel with each other, a first operational amplifier having a non-inverting input terminal connected to an emitter of the sense transistor and an inverting input terminal connected to an emitter of the power transistor, a resistor element having one end connected to the emitter of the sense transistor and another end connected to a first node, and an adjustment transistor placed between the first node and a low-voltage power supply. The first operational amplifier adjusts a current flowing through the adjustment transistor so that an emitter voltage of the power transistor and an emitter voltage of the sense transistor are substantially the same.

10 Claims, 8 Drawing Sheets

(58) Field of Classification Search
CPC ........... H03K 17/04123; H03K 17/687; H03K 17/6872; H03K 19/09448; H03L 17/102; G05F 3/262; G05F 3/20; G05F 1/465; H04L 25/028; H04L 25/0272
See application file for complete search history.

(56) References Cited

U.S. PATENT DOCUMENTS

| | | | |
|---|---|---|---|
| 7,602,595 B2 | | 10/2009 | Hiyama |
| 9,712,149 B2* | | 7/2017 | Kaeriyama ........ H03K 17/0828 |
| 2016/0233856 A1* | | 8/2016 | Wasekura .......... H03K 17/0828 |

FOREIGN PATENT DOCUMENTS

| | | | |
|---|---|---|---|
| JP | 2008-206348 A | 9/2008 |
| JP | 2010-147501 A | 7/2010 |
| JP | 2015-220932 A | 12/2015 |

OTHER PUBLICATIONS

Non-final Office Action issued in counterpart U.S. Appl. No. 14/856,059, dated Oct. 17, 2016.

\* cited by examiner

SEMICONDUCTOR DEVICE

CROSS-REFERENCE TO RELATED APPLICATIONS

This application is a Continuation of U.S. application Ser. No. 14/856,059, filed on Sep. 16, 2015, claiming priority benefit from Japanese patent application No. 2014-190819, filed on Sep. 19, 2014, the disclosure of which is incorporated herein in its entirety by reference.

BACKGROUND

The present invention relates to a semiconductor device and, for example, relates to a semiconductor device including a power transistor.

A power transistor is widely used today as an element that passes a current through a load requiring a large current. As the power transistor, an element using a bipolar transistor or an element using MOSFET (Metal-Oxide-Semiconductor Field-Effect Transistor) is used, for example. Particularly, IGBT (Insulated Gate Bipolar Transistor) is commonly used.

A device in which a power transistor is used is provided with a circuit that detects an overcurrent in order to prevent breakdown of the device due to short-circuit of a load. For example, by placing a sense transistor smaller than a power transistor in parallel with the power transistor and monitoring a current flowing through the emitter of the sense transistor, it is possible to monitor a current flowing through the power transistor. For example, by placing a shunt resistor on the emitter side of the sense transistor and monitoring a voltage between terminals of the shunt resistor, it is possible to monitor a current flowing through the emitter of the sense transistor.

However, if the shunt resistor is placed, the emitter voltage of the sense transistor differs from the emitter voltage of the power transistor under the effect of the voltage occurring at the shunt resistor. Therefore, a current detection circuit that is formed using the sense transistor and the shunt resistor has a problem that the detection accuracy is low.

In the technique disclosed in Japanese Unexamined Patent Application Publication No. H11-299218, an operational amplifier that virtually short-circuits the emitter of the power transistor and the emitter of the sense transistor is placed in order to solve the above problem. By placing such an operational amplifier, it is possible to substantially equalize the emitter voltage of the power transistor and the emitter voltage of the sense transistor and thereby improve the detection accuracy of the current detection circuit.

SUMMARY

A current flowing through the sense transistor is smaller than a current flowing through the power transistor; however, because a large current flows through the power transistor, a certain level of current flows through the sense transistor as well. For example, when the ratio (sense ratio) between a current flowing through the emitter of the power transistor and a current flowing through the emitter of the sense transistor is 1000:1, if a current of 400 A flows through the emitter of the power transistor, a current of 400 mA flows through the emitter of the sense transistor.

In the technique disclosed in Japanese Unexamined Patent Application Publication No. H11-299218, by virtually short-circuiting the emitter of the power transistor and the emitter of the sense transistor using the operational amplifier, the emitter voltage of the power transistor and the emitter voltage of the sense transistor are substantially equalized. The output terminal of the operational amplifier is electrically connected to the emitter of the sense transistor, and a current flowing through the emitter of the sense transistor is taken using the operational amplifier. Therefore, there is a problem that, when a current flowing through the sense transistor increases, the operational amplifier generates heat, and the current detection circuit that includes the operational amplifier also generates heat.

The other problems and novel features of the present invention will become apparent from the description of the specification and the accompanying drawings.

A semiconductor device according to one embodiment includes a power transistor and a sense transistor connected in parallel with each other, a first operational amplifier having a first input terminal connected to an emitter of the sense transistor and a second input terminal connected to an emitter of the power transistor, a resistor element having one end connected to the emitter of the sense transistor and another end connected to a first node, and an adjustment transistor placed between the first node and a low-voltage power supply. The first operational amplifier adjusts a current flowing through the adjustment transistor so that an emitter voltage of the power transistor and an emitter voltage of the sense transistor are substantially the same.

According to the above embodiment, it is possible to provide a semiconductor device that can suppress the heating of a current detection circuit even when a large current flows through a power transistor.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

<First Embodiment>

Figure 1:
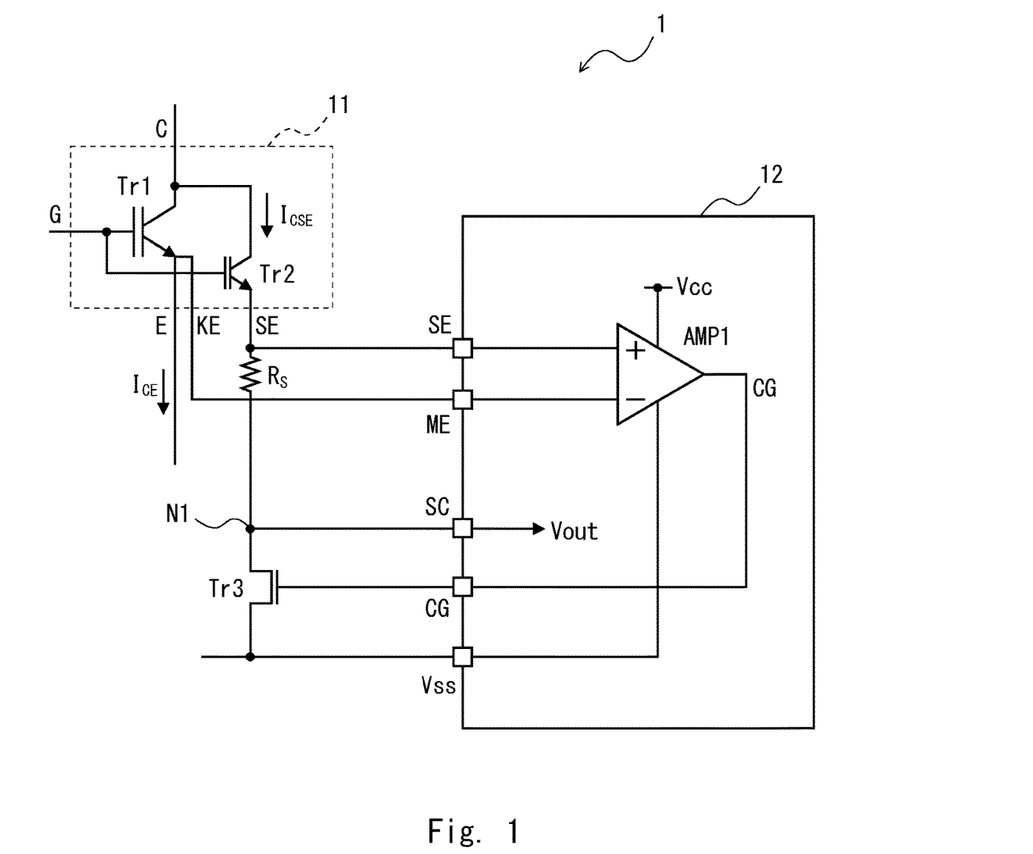
FIG. 1 is a circuit diagram showing one example of a semiconductor device according to a first embodiment.

A first embodiment is described hereinafter with reference to the drawings. FIG. 1 is a circuit diagram showing one example of a semiconductor device according to the first embodiment. As shown in FIG. 1, a semiconductor device 1 according to this embodiment includes a power transistor circuit 11, a current detection circuit 12, a shunt resistor Rs, and an adjustment transistor Tr3.

The power transistor circuit 11 includes a power transistor Tr1 and a sense transistor Tr2. The sense transistor Tr2 is an element that is placed for detecting a current flowing through the emitter of the power transistor Tr1. A current that flows through the emitter SE of the sense transistor Tr2 is smaller than a current that flows through the emitter E of the power transistor Tr1. As one example, the ratio (sense ratio) between a current that flows through the emitter E of the power transistor Tr1 and a current that flows through the emitter SE of the sense transistor Tr2 may be approximately 1000:1. The gate of the sense transistor Tr2 is connected to the gate of the power transistor Tr1, and the collector of the sense transistor Tr2 is connected to the collector of the power transistor Tr1. In other words, the sense transistor Tr2 is connected in parallel with the power transistor Tr1.

A load (not shown) is connected to the emitter E of the power transistor Tr1. An emitter current $I_{CE}$ flows through the emitter E of the power transistor Tr1. Further, the emitter KE of the power transistor Tr1 (which is a Kelvin emitter in this case) is connected to the inverting input terminal (second input terminal) of an operational amplifier AMP1 (first operational amplifier) included in the current detection circuit 12. The emitter SE of the sense transistor Tr2 is connected to the non-inverting input terminal (first input terminal) of the operational amplifier AMP1. One end of the shunt resistor Rs (resistor element) is connected to the emitter SE of the sense transistor Tr2, and the other end of the same is connected to a node N1.

The adjustment transistor Tr3 is placed between the node N1 and a low-voltage power supply Vss. Specifically, the collector of the adjustment transistor Tr3 is connected to the node N1, the emitter of the adjustment transistor Tr3 is connected to the power supply Vss, and the output CG of the operational amplifier AMP1 is supplied to the base of the adjustment transistor Tr3. Note that the adjustment transistor Tr3 may be formed using MOSFET. When using MOSFET, the drain of the adjustment transistor Tr3 is connected to the node N1, the source of the adjustment transistor Tr3 is connected to the power supply Vss, and the output CG of the operational amplifier AMP1 is supplied to the gate of the adjustment transistor Tr3. Hereinafter, the case where the adjustment transistor Tr3 is formed using MOSFET is described as one example.

The operational amplifier AMP1 is placed in the current detection circuit 12. The current detection circuit 12 is formed on a semiconductor chip (IC) which is different from a semiconductor chip (IC) that forms the power transistor circuit 11. Further, the adjustment transistor Tr3 is placed outside the current detection circuit 12 (which is outside the semiconductor chip including the current detection circuit 12).

The voltage of the node N1 corresponds to the current $I_{CE}$ flowing through the power transistor Tr1, and it is possible to monitor the current $I_{CE}$ flowing through the power transistor Tr1 by monitoring the voltage of the node N1.

In this embodiment, in order to keep the voltage of the emitter SE (which is also referred to hereinafter as a sense emitter SE) of the sense transistor Tr2 to be substantially the same as the voltage of the main emitter E of the power transistor Tr1, feedback control of the voltage of one end of the shunt resistor Rs (which is the voltage of the sense emitter SE) is performed using the operational amplifier AMP1. Specifically, the operational amplifier AMP1 adjusts a current flowing through the adjustment transistor Tr3 so that the voltage of the main emitter E and the voltage of the sense emitter SE are substantially the same. In this embodiment, the Kelvin emitter KE is placed to acquire the voltage of the main emitter E. The Kelvin emitter KE is a line that is drawn from the near point to an element that forms the power transistor Tr1. The voltage of the main emitter E is the same as the voltage of the Kelvin emitter KE, and "the voltage of the main emitter E" and "the voltage of the Kelvin emitter KE" are hereinafter used as the same meaning.

When the voltage of the sense emitter SE is higher than the voltage of the Kelvin emitter KE, the output voltage CG of the operational amplifier AMP1 becomes higher, and the gate voltage of the adjustment transistor Tr3 increases. A current flowing through the adjustment transistor Tr3 thereby increases, and the voltage of the sense emitter SE decreases. On the contrary, when the voltage of the Kelvin emitter KE is higher than the voltage of the sense emitter SE, the output voltage CG of the operational amplifier AMP1 becomes lower, and the gate voltage of the adjustment transistor Tr3 decreases. A current flowing through the adjustment transistor Tr3 thereby decreases, and the voltage of the sense emitter SE increases. Then, it balances out when the input voltage of the non-inverting input terminal and the input voltage of the inverting input terminal of the operational amplifier AMP1 (which are the voltage of the sense emitter SE and the voltage of the Kelvin emitter KE) become the same.

By placing the operational amplifier AMP1 in this manner, the voltage of the sense emitter SE can be kept substantially the same as the voltage of the Kelvin emitter KE, and it is thereby possible to align the bias conditions of the power transistor Tr1 and the sense transistor Tr2 (the both transistors are in the same semiconductor substrate). Accordingly, it is possible to keep the sense ratio of the power transistor Tr1 and the sense transistor Tr2 (the ratio of a current flowing through the emitter E of the power transistor Tr1 and a current flowing through the sense emitter SE of the sense transistor Tr2) constant regardless of the temperature, gate voltage and collector voltage. As a result, a current proportional to a current flowing through the emitter E of the power transistor Tr1 flows through the sense emitter SE. Thus, due to a voltage drop by the shunt resistor Rs, a voltage proportional to a current flowing through the emitter E of the power transistor Tr1 occurs at the node N1. When a current flowing through the emitter E of the power transistor Tr1 is $I_{CE}$, a current flowing through the sense emitter SE is $I_{CSE}$, a sense ratio is γ, and a voltage of the node N1 is $V_{SC}$, $V_{SC}=-Rs \cdot I_{CSE}=-Rs \cdot \gamma \cdot I_{CE}$. Thus, as a current flowing through the emitter E of the power transistor Tr1 becomes larger, a voltage of the node N1 decreases.

At this time, the configuration is constructed so that the low-voltage power supply Vss of the operational amplifier AMP1 and the low-voltage power supply Vss connected with the source of the adjustment transistor Tr3 are lower than the voltage of the Kelvin emitter KE of the power transistor Tr1.

Particularly, in this embodiment, it is preferred that the low-voltage power supply Vss of the operational amplifier AMP1 is a negative voltage. Specifically, as shown in a semiconductor device 1' of FIG. 2, the inverting input terminal of the operational amplifier AMP1 may be connected to a ground potential (GND), and the source of the adjustment transistor Tr3 may be connected to a negative potential. In this case, because the non-inverting input terminal of the operational amplifier AMP1 acts as a virtual ground, the voltage of the sense emitter SE converges to the same potential as the voltage of the Kelvin emitter KE.

Figure 2:
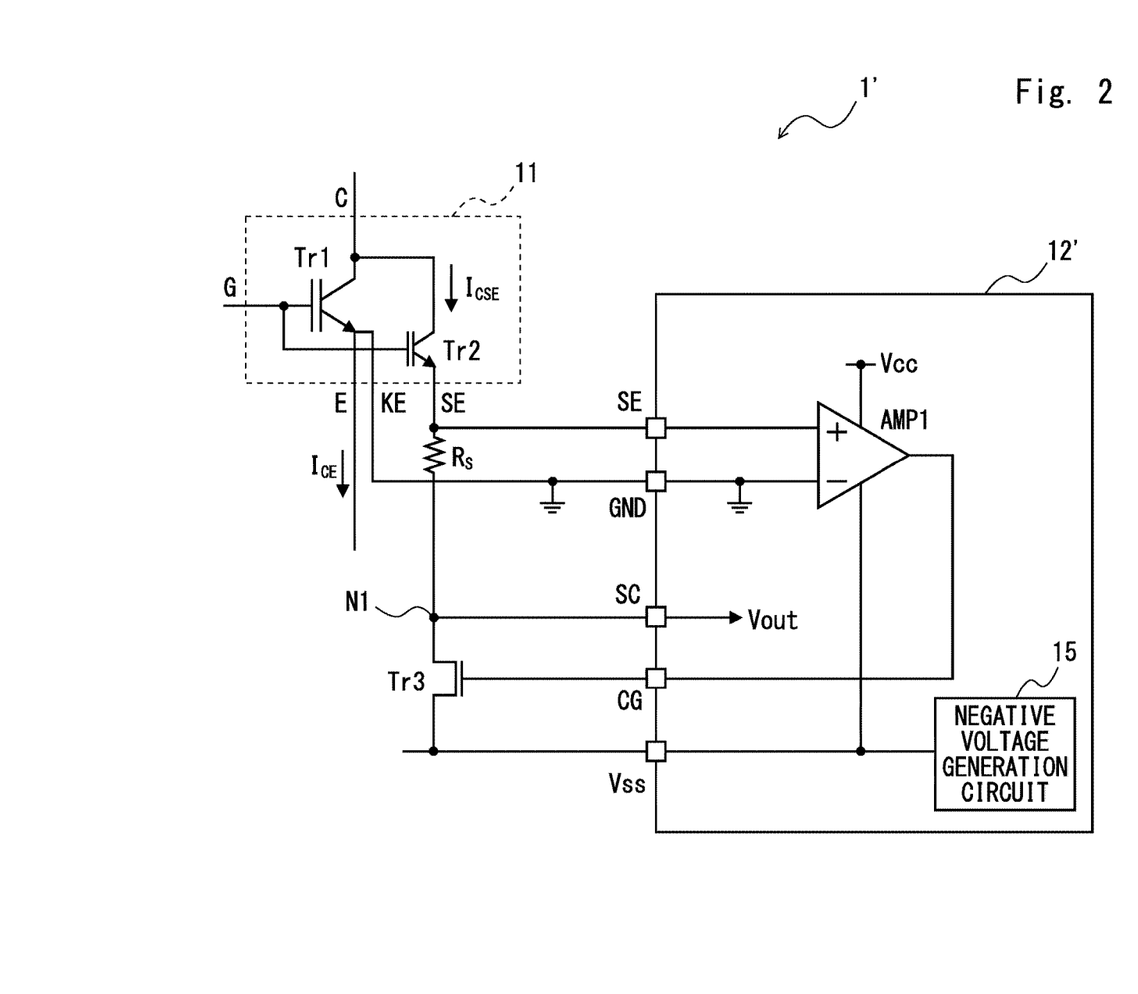
FIG. 2 is a circuit diagram showing another example of a semiconductor device according to the first embodiment.

To be specific, in the configuration example shown in FIG. 2, the voltage of the sense emitter SE needs to be kept the same as the voltage of the Kelvin emitter KE with a current flowing through the shunt resistor Rs. Because the main emitter E is generally connected to the GND of the gate driver circuit, it is necessary to supply a lower negative voltage than that of the sense emitter SE to the other end (node N1) of the shunt resistor Rs. Therefore, the low-voltage power supply Vss of the operational amplifier AMP1 and the source of the adjustment transistor Tr3 are connected to the negative power supply.

For example, as shown in FIG. 2, a negative voltage generation circuit 15 may be placed in a current detection circuit 12' (which is in a semiconductor chip that forms the current detection circuit 12') as the negative power supply. The negative voltage generation circuit 15 may be formed using a charge pump circuit, for example. In this manner, by placing the negative voltage generation circuit 15 in the current detection circuit 12', it is possible to reduce the number of external parts and thereby reduce the manufacturing cost.

Figure 3:
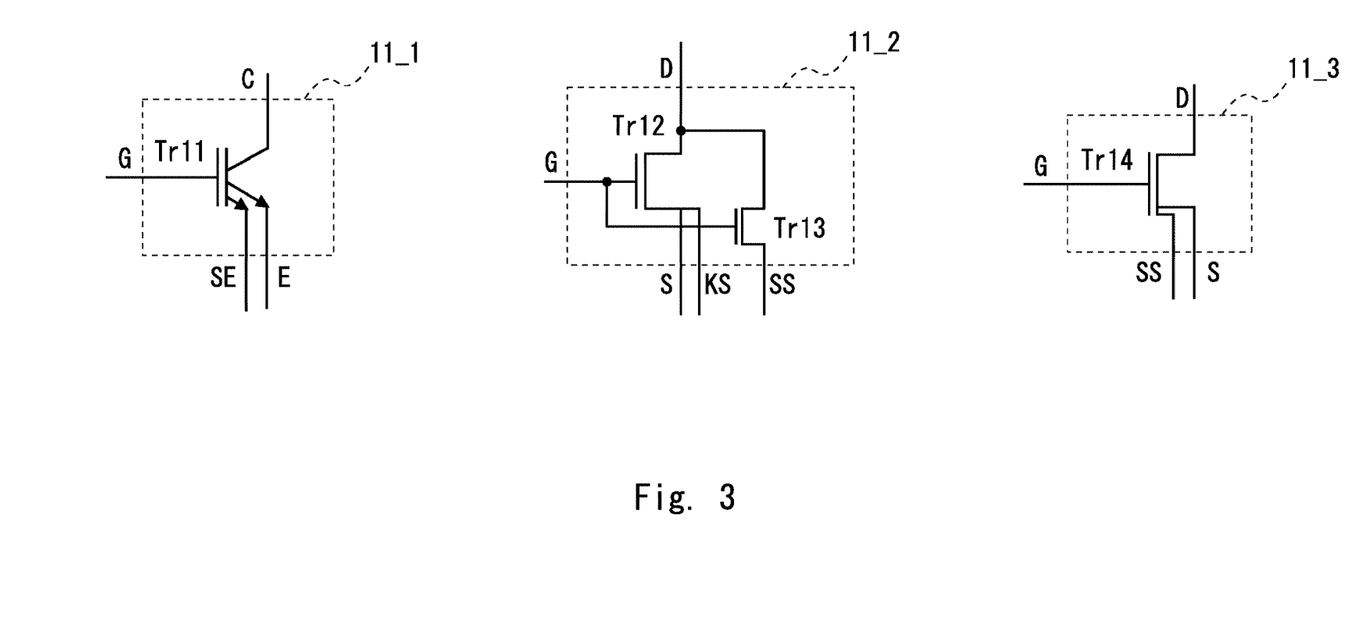
FIG. 3 is a circuit diagram showing another configuration example of a power transistor circuit.

FIG. 3 is a circuit diagram showing another configuration example of the power transistor circuit 11. The power transistor circuit 11 shown in FIG. 1 has a configuration in which the power transistor Tr1 and the sense transistor Tr2 are formed using different transistors. However, in this embodiment, some emitters of a plurality of transistor elements that form a power transistor Tr11 may be used as the sense emitter SE as shown in a power transistor circuit 11_1 in FIG. 3. Specifically, the power transistor Tr11 has a configuration in which a plurality of transistor elements are connected in parallel, and the emitters of the plurality of transistor elements may be divided into the main emitter E and the sense emitter SE. In this case, the number of emitters that form the sense emitter SE is smaller than the number of emitters that form the main emitter E. The ratio of the number of emitters that form the main emitter E and the number of emitters that form the sense emitter SE corresponds to the sense ratio.

Further, as shown in a power transistor circuit 11_2 in FIG. 3, the power transistor circuit may be formed using MOSFET in this embodiment. Specifically, the power transistor circuit 11_2 includes a power MOSFET (Tr12) and a sense MOSFET (Tr13). The gate of the sense MOSFET (Tr13) is connected to the gate of the power MOSFET (Tr12), and the drain of the sense MOSFET (Tr13) is connected to the drain of the power MOSFET (Tr12). In other words, the sense MOSFET (Tr13) is connected in parallel with the power MOSFET (Tr12).

The power transistor circuit 11_2 has a configuration in which the power MOSFET (Tr12) and a sense MOSFET (Tr13) are formed using different MOSFET as an example. However, in this embodiment, some sources of a plurality of transistor elements that form a power MOSFET (Tr14) may be used as a sense source SS as shown in a power transistor circuit 11_3 in FIG. 3. Specifically, the power MOSFET (Tr14) has a configuration in which a plurality of transistor elements are connected in parallel, and the sources of the plurality of transistor elements may be divided into the main source S and the sense source SS. In this case, the number of emitters that form the sense source SS is smaller than the number of emitters that form the main source S. The ratio of the number of sources that form the main source S and the number of sources that form the sense source SS corresponds to the sense ratio.

As described above, MOSFET can be used as the transistor in this embodiment. In this specification, each terminal of the transistor is referred to as "base or gate", "collector or drain" or "emitter or source" in some cases.

In the technique disclosed in Japanese Unexamined Patent Application Publication No. H11-299218, in order to improve the detection accuracy of the current detection circuit that detects a current flowing through the power transistor, the emitter of the power transistor and the emitter of the sense transistor are virtually short-circuited using the operational amplifier, so that the emitter voltage of the power transistor and the emitter voltage of the sense transistor are substantially equalized. However, in the technique disclosed in Japanese Unexamined Patent Application Publication No. H11-299218, the output terminal of the operational amplifier is electrically connected to the emitter of the sense transistor, and a current flowing through the emitter of the sense transistor is taken using the operational amplifier. Therefore, there is a problem that, when a current flowing through the sense transistor increases, the operational amplifier generates heat, and the current detection circuit that includes the operational amplifier also generates heat.

In view of the above, in this embodiment, the adjustment transistor Tr3 is placed between the node N1 and the low-voltage power supply Vss as shown in FIGS. 1 and 2. Then, the output of the operational amplifier AMP1 is supplied to the gate of the adjustment transistor Tr3, and a current flowing through the adjustment transistor Tr3 is adjusted so that the voltage of the Kelvin emitter KE and the voltage of the sense emitter SE are substantially the same. Therefore, even when a current flowing through the sense transistor Tr2 becomes large, it is possible to prevent heating of the operational amplifier AMP1. Specifically, when a current flowing through the sense transistor Tr2 becomes large, a current flowing through the adjustment transistor Tr3 also becomes large; however, because this does not affect the operational amplifier AMP1, it is possible to prevent the operational amplifier AMP1 from generating heat.

Further, in this embodiment, the adjustment transistor Tr3 is placed outside the current detection circuit 12. Specifically, the adjustment transistor Tr3 is placed on a semiconductor chip (IC) different from the semiconductor chip (IC) including the operational amplifier AMP1. Therefore, even when a current flowing through the adjustment transistor Tr3 becomes large (that is, when a current flowing through the sense transistor Tr2 becomes large), and the heating value of the adjustment transistor Tr3 increases, it is possible to prevent the heating of the adjustment transistor Tr3 from affecting the current detection circuit 12. Further, in this case, it is only necessary to change the size of the adjustment transistor Tr3 in accordance with the size of the power transistor Tr1 to be used, and therefore the semiconductor chip (IC) can be easily generalized.

Figure 7:
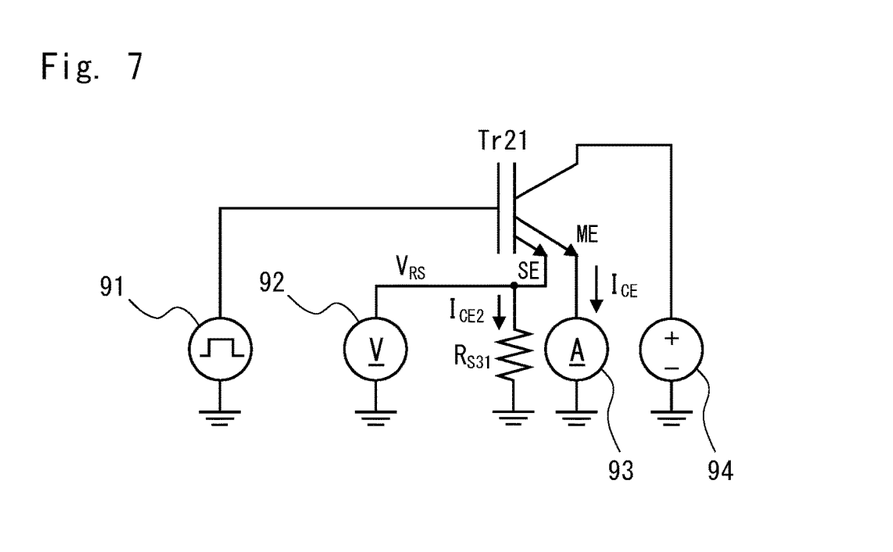
FIG. 7 is a circuit diagram illustrating a comparative example.

FIG. 7 is a circuit diagram illustrating a comparative example, and it shows a circuit for inspecting the relationship between a current $I_{CE}$ flowing through the main emitter ME of a power transistor Tr21 and a current $I_{CE2}$ flowing through the sense emitter SE. As shown in FIG. 7, a gate control signal is supplied from a control signal generation circuit 91 to the gate of the power transistor Tr21. A current is supplied from a current source 94 to the collector of the power transistor Tr21. A shunt resistor $R_{S31}$ is connected to the sense emitter SE. A voltage $V_{RS}$ between the both terminals of the shunt resistor $R_{S31}$ is measured using a voltmeter 92. The voltage $V_{RS}$ corresponds to the current $I_{CE2}$ flowing through the sense emitter SE. The current $I_{CE}$ flowing through the main emitter ME is measured using an ammeter 93.

Figure 8:
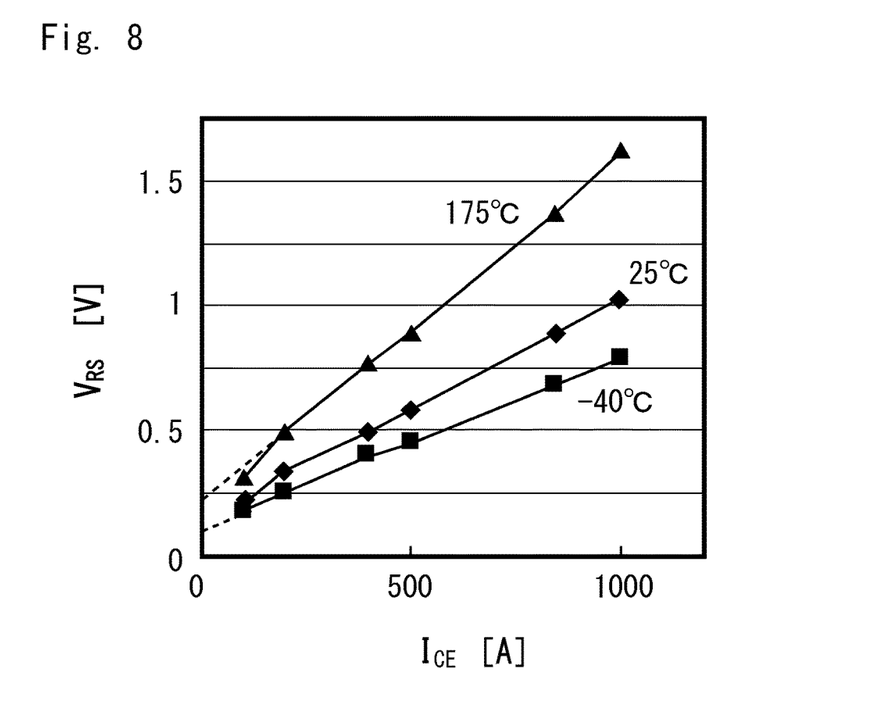
FIG. 8 is a graph showing a relationship between a current $I_{CE}$ flowing through a main emitter of the power transistor and a voltage $V_{RS}$ in a shunt resistor shown in FIG. 7.

FIG. 8 is a graph showing the relationship between the current $I_{CE}$ flowing through the main emitter ME of the power transistor Tr21 and the voltage $V_{RS}$ between the both terminals of the shunt resistor $R_{S31}$ shown in FIG. 7. As shown in FIG. 8, the current $I_{CE}$ flowing through the main emitter ME and the voltage $V_{RS}$ in the shunt resistor $R_{S31}$ are proportional. However, the ratio (sense ratio) of the current $I_{CE}$ flowing through the main emitter ME and the shunt resistor voltage $V_{RS}$ depends on temperature (junction temperature). Specifically, when the junction temperature of the power transistor Tr21 becomes higher, a threshold voltage of the power transistor Tr21 becomes lower, and the shunt resistor voltage $V_{RS}$ with respect to the current $I_{CE}$ varies (the voltage of the sense emitter SE becomes higher than the voltage of the main emitter ME). In this manner, the current detection circuit formed using the sense transistor and the shunt resistor has a problem that the detection accuracy is low because the shunt resistor voltage $V_{RS}$ varies with a change in the junction temperature of the power transistor Tr21.

Figure 9:
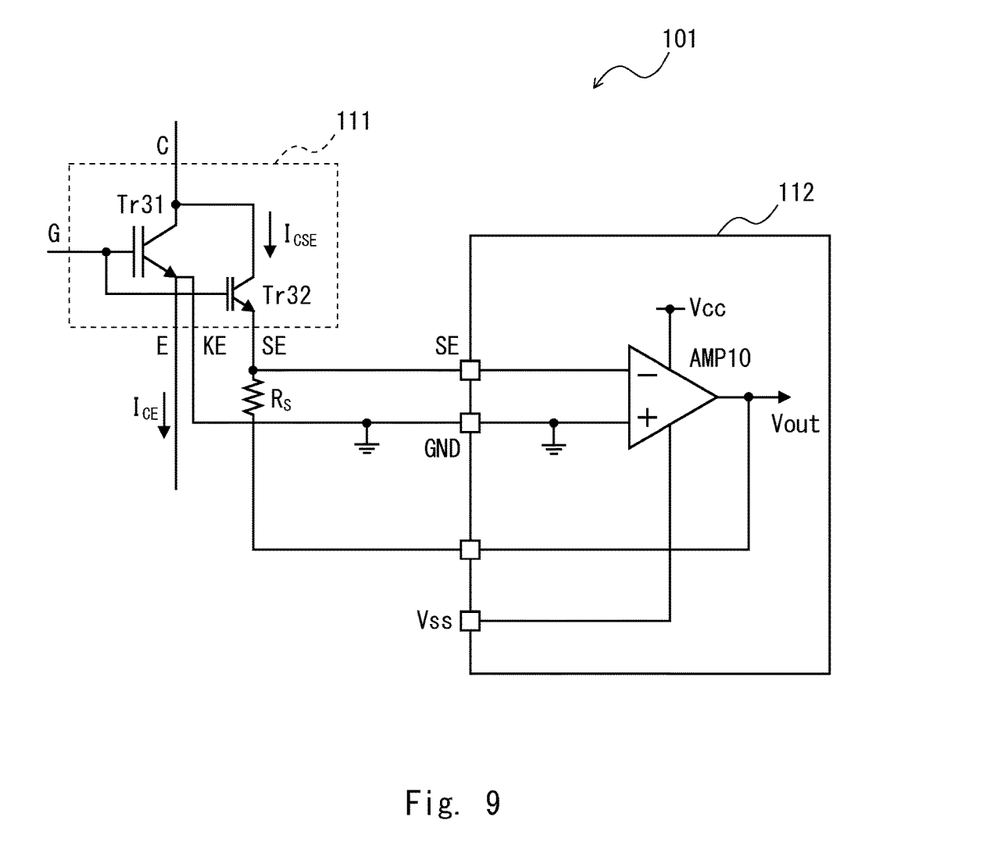
FIG. 9 is a circuit diagram illustrating a semiconductor device according to a comparative example.

FIG. 9 is a circuit diagram illustrating a semiconductor device according to a comparative example, and it shows a semiconductor device that can solve the above problem. A semiconductor device 101 shown in FIG. 9 includes a power transistor circuit 111, a current detection circuit 112, and a shunt resistor Rs.

The power transistor circuit 111 includes a power transistor Tr31 and a sense transistor Tr32. The gate of the sense transistor Tr32 is connected to the gate of the power transistor Tr31, and the collector of the sense transistor Tr32 is connected to the collector of the power transistor Tr31. In other words, the sense transistor Tr32 is connected in parallel with the power transistor Tr31.

A load (not shown) is connected to the emitter E of the power transistor Tr31. An emitter current $I_{CE}$ flows through the emitter E of the power transistor Tr31. Further, the Kelvin emitter KE of the power transistor Tr31 is connected to the non-inverting input terminal of an operational amplifier AMP10 included in a current detection circuit 112. The emitter SE of the sense transistor Tr32 is connected to the inverting input terminal of the operational amplifier AMP10. One end of the shunt resistor Rs is connected to the emitter SE of the sense transistor Tr32, and the other end of the shunt resistor Rs is connected to the output terminal of the operational amplifier AMP10.

In this manner, the semiconductor device 101 according to the comparative example shown in FIG. 9 includes the operational amplifier AMP10 that virtually short-circuits the Kelvin emitter KE and the sense emitter SE in order to prevent the voltage of the sense emitter SE from being different from the voltage of the Kelvin emitter KE. Specifically, by placing the operational amplifier AMP10, the voltage of the Kelvin emitter KE and the voltage of the sense emitter SE can be substantially the same, and it is thereby possible to improve the detection accuracy of the current detection circuit.

However, in the semiconductor device 101 shown in FIG. 9, the output terminal of the operational amplifier AMP10 is electrically connected to the sense emitter SE through the shunt resistor, and a current flowing through the sense emitter SE is taken using the operational amplifier AMP10. Therefore, there is a problem that, when a current flowing through the sense emitter SE increases, the operational amplifier AMP10 generates heat, and the current detection circuit 112 that includes the operational amplifier AMP10 also generates heat.

In view of the above, in this embodiment, the adjustment transistor Tr3 is placed between the node N1 and the low-voltage power supply Vss as shown in FIGS. 1 and 2. Then, the output of the operational amplifier AMP1 is supplied to the gate of the adjustment transistor Tr3, and a current flowing through the adjustment transistor Tr3 is adjusted so that the voltage of the Kelvin emitter KE and the voltage of the sense emitter SE are substantially the same. Therefore, even when a current flowing through the sense transistor Tr2 becomes large, it is possible to prevent heating of the operational amplifier AMP1. Specifically, when a current flowing through the sense transistor Tr2 becomes large, a current flowing through the adjustment transistor Tr3 also becomes large; however, because this does not affect the operational amplifier AMP1, it is thereby possible to prevent the operational amplifier AMP1 from generating heat.

According to the embodiment described above, it is possible to provide a semiconductor device that can suppress the heating of the current detection circuit even when a large current flows through the power transistor.

<Second Embodiment>

Figure 4:
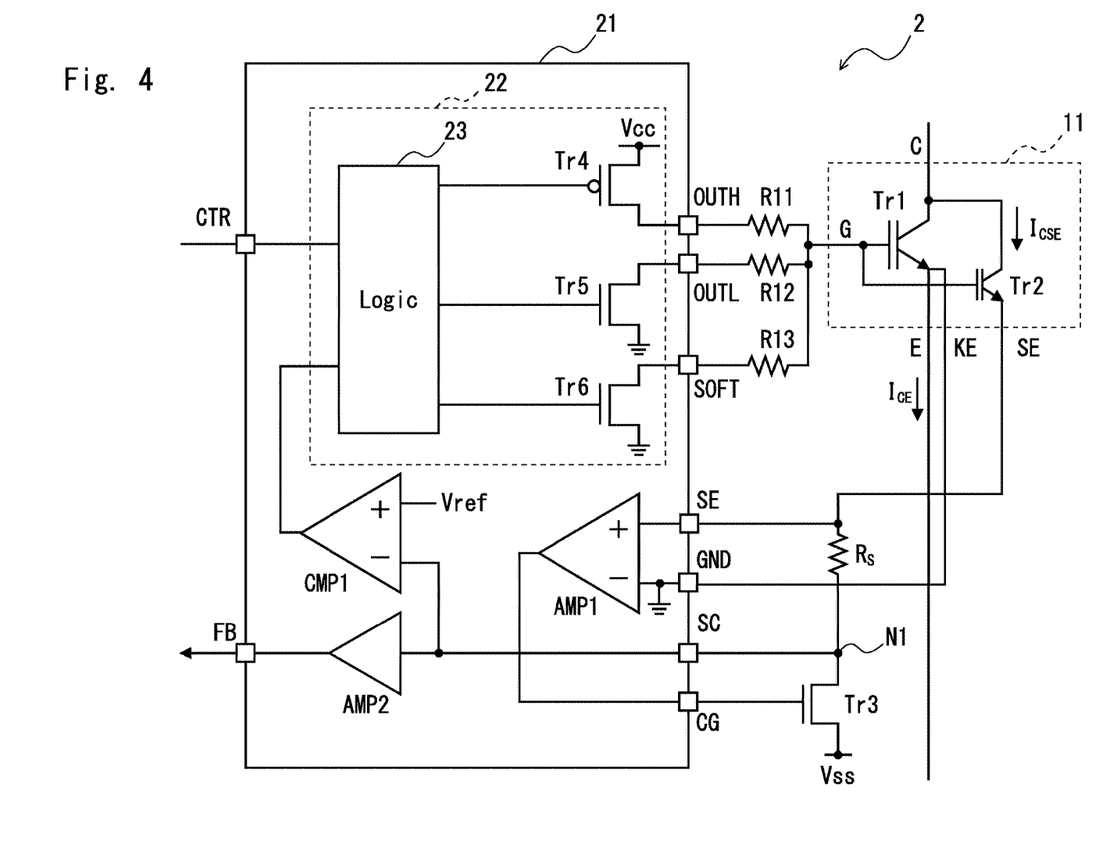
FIG. 4 is a circuit diagram showing one example of a semiconductor device according to a second embodiment.

A second embodiment is described hereinafter. FIG. 4 is a circuit diagram showing one example of a semiconductor device according to the second embodiment. In a semiconductor device 2 shown in FIG. 4, an example in which the current detection circuit 12 described in the first embodiment is incorporated into a drive circuit (IC) 21 is shown.

As shown in FIG. 4, the semiconductor device 2 according to this embodiment includes a power transistor circuit 11, a drive circuit 21, a shunt resistor Rs, and an adjustment transistor Tr3. Note that the configuration and operation of the power transistor circuit 11, the shunt resistor Rs and the adjustment transistor Tr3 are the same as those described in the first embodiment and not redundantly described.

The drive circuit 21 drives the power transistor circuit 11. The drive circuit 21 includes operational amplifiers AMP1 and AMP2, a comparator CMP1, and a gate driver 22. Note that the configuration and operation of the operational amplifier AMP1 are the same as those of the operational amplifier AMP1 described in the above embodiment and not redundantly described.

The gate driver 22 includes a control circuit 23 and transistors Tr4 to Tr6. The control circuit 23 receives a control command signal CTR and controls the transistors Tr4 and Tr5 according to the control command signal CTR. Further, the control circuit 23 controls the transistor Tr6 according to the output of the comparator CMP1. The transistor Tr4 is a P-type transistor. The source of the transistor Tr4 is connected to a high voltage power supply Vcc, the drain of the transistor Tr4 is connected to an output terminal OUTH, and a control signal from the control circuit 23 is supplied to the gate of the transistor Tr4. The output terminal OUTH is connected to the gates of the power transistor Tr1 and the sense transistor Tr2 through a resistor R11.

The transistor Tr5 is an N-type transistor. The source of the transistor Tr5 is connected to the ground potential, the drain of the transistor Tr5 is connected to an output terminal OUTL, and a control signal from the control circuit 23 is supplied to the gate of the transistor Tr5. The output terminal OUTL is connected to the gates of the power transistor Tr1 and the sense transistor Tr2 through a resistor R12. The transistor Tr6 is an N-type transistor. The source of the transistor Tr6 is connected to the ground potential, the drain of the transistor Tr6 is connected to an output terminal SOFT, and a control signal from the control circuit 23 is supplied to the gate of the transistor Tr6. The output terminal SOFT is connected to the gates of the power transistor Tr1 and the sense transistor Tr2 through a resistor R13.

For example, the same level of signal is supplied to the gate of the transistor Tr4 and the gate of the transistor Tr5.

When a low level signal is supplied to each of the gates of the transistors Tr4 and Tr5, the transistor Tr4 becomes ON, and the transistor Tr5 becomes OFF. At this time, the output terminals OUTH and OUTL are HIGH, and the gates of the power transistor Tr1 and the sense transistor Tr2 are HIGH. Accordingly, the power transistor Tr1 and the sense transistor Tr2 become ON, and a current flows through the power transistor Tr1 and the sense transistor Tr2.

On the other hand, when a high level signal is supplied to each of the gates of the transistors Tr4 and Tr5, the transistor Tr4 becomes OFF, and the transistor Tr5 becomes ON. At this time, the output terminals OUTH and OUTL are LOW, and the gates of the power transistor Tr1 and the sense transistor Tr2 are LOW. Accordingly, the power transistor Tr1 and the sense transistor Tr2 become OFF, and a current does not flow through the power transistor Tr1 and the sense transistor Tr2.

For example, by supplying a pulse control signal from the control circuit 23 to the gates of the transistors Tr4 and Tr5 and adjusting the duty ratio of this pulse, it is possible to adjust the amount of current supplied from the power transistor Tr1 to the load.

The amplifier AMP2 receives a voltage of the node N1, amplifies the voltage of the node N1 and outputs it as a feedback signal FB. Note that the voltage of the node N1 corresponds to the current $I_{CE}$ flowing through the power transistor Tr1, and it is possible to monitor the current $I_{CE}$ flowing through the power transistor Tr1 by monitoring the voltage of the node N1.

A reference voltage Vref is supplied to the non-inverting input terminal of the comparator CMP1, and the voltage of the node N1 is supplied to the inverting input terminal of the comparator CMP1. The comparator CMP1 compares the reference voltage Vref and the voltage of the node N1 and outputs a comparison result to the control circuit 23 of the gate driver 22. When the comparison result from the comparator CMP1 indicates that an overcurrent is flowing through the power transistor Tr1, the control circuit 23 switches the power transistor Tr1 to the OFF state.

Specifically, because a voltage of the node N1 decreases as a current flowing through the emitter E of the power transistor Tr1 becomes larger, when the voltage of the node N1 falls below the reference voltage Vref, the comparator CMP1 detects an overcurrent and outputs a high level detection signal to the control circuit 23. When the control circuit 23 receives the high level detection signal from the comparator CMP1, it outputs a high level signal to the transistor Tr6. The transistor Tr6 thereby becomes ON, the gate of the power transistor Tr1 becomes LOW level, and the power transistor Tr1 becomes OFF.

In the comparative example shown in FIG. 7, because the voltage of the sense emitter SE is different from the voltage of the Kelvin emitter KE, bias dependence occurs in a current flowing through the sense emitter SE, which degrades the detection accuracy of the current detection circuit. Therefore, it is necessary to set a high detection threshold value in order to prevent the lower limit of the variation of the detection threshold from overlapping the range of a normal operating current. However, because a large current flows at the time of short-circuit in the power transistor such as IGBT, it is required to allow for a certain margin to the upper limit of the variation of the detection threshold. It is thereby necessary to use a large power transistor, which increases the cost.

On the other hand, in the semiconductor device according to this embodiment shown in FIG. 4, because the detection accuracy of the current detection circuit can be improved (see the first embodiment), it is possible to allow a low short-circuit tolerance of the power transistor, thereby enabling use of a smaller power transistor. For example, because the current density of the power transistor can increase, it is possible to obtain a necessary current with a smaller power transistor than before.

<Third Embodiment>

Figure 5:
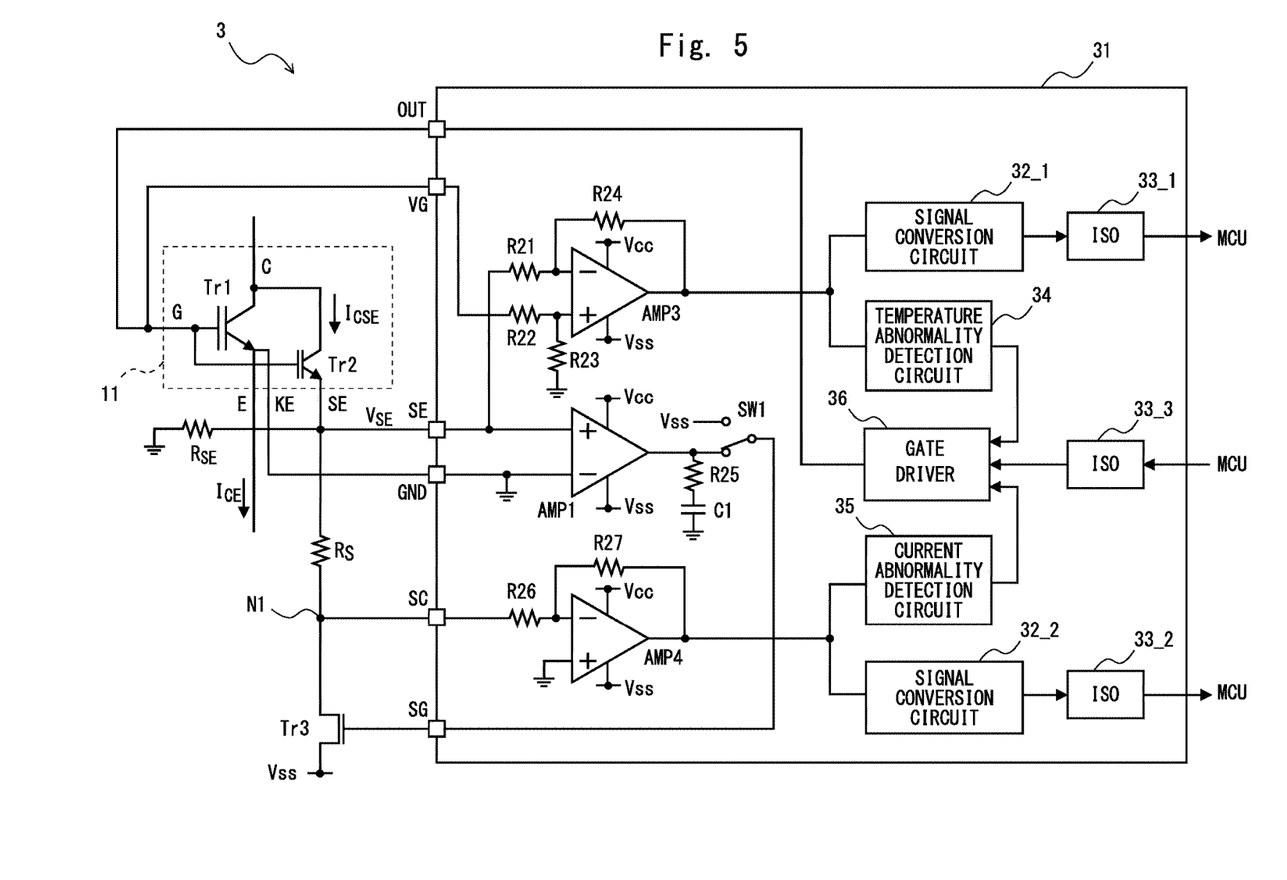
FIG. 5 is a circuit diagram showing one example of a semiconductor device according to a third embodiment.

A third embodiment is described hereinafter. FIG. 5 is a circuit diagram showing one example of a semiconductor device according to the third embodiment. In this embodiment, a semiconductor device that has a function of estimating the junction temperature of the power transistor circuit 11 (particularly, the power transistor Tr1) is described.

As shown in FIG. 5, a semiconductor device 3 according to this embodiment includes a power transistor circuit 11, a drive circuit 31, a shunt resistor Rs, and an adjustment transistor Tr3. Note that the configuration and operation of the power transistor circuit 11, the shunt resistor Rs and the adjustment transistor Tr3 are the same as those described in the first embodiment and not redundantly described below.

The drive circuit 31 includes a switching element SW1. The switching element SW1 is configured to be capable of switching between the case where the output of the operational amplifier AMP1 is supplied to the gate of the adjustment transistor Tr3 and the case where a voltage Vss for turning the adjustment transistor Tr3 OFF (which is the same voltage as the source voltage of the adjustment transistor Tr3) is supplied to the gate of the adjustment transistor Tr3. A resistor R25 and a capacitor C1 are connected in series between the output terminal of the operational amplifier AMP1 and the ground potential.

When the switching element SW1 is connected to the output terminal of the operational amplifier AMP1, the operational amplifier AMP1 adjusts a current flowing through the adjustment transistor Tr3 so that the voltage of the Kelvin emitter KE and the voltage of the sense emitter SE are substantially the same as described in the first embodiment. On the other hand, when the switching element SW1 is connected to the low-voltage power supply Vss, the adjustment transistor Tr3 is forced to be OFF. In this case, the operational amplifier AMP1 does not perform feedback control for making the voltage of the Kelvin emitter KE and the voltage of the sense emitter SE substantially the same. Accordingly, the voltage of the sense emitter SE becomes a voltage dependent on the junction temperature of the power transistor circuit 11. Thus, the voltage of the sense emitter SE in this case can be used as temperature information of the power transistor Tr1.

For example, when the adjustment transistor Tr3 is turned OFF under the condition that $V_{CE}$ is sufficiently higher than $V_{GE}$ and $V_{GE}$ is higher than $V_{TH}$, the voltage $V_{SE}$ of the sense emitter SE is $V_{GE}-V_{TH}$. The voltage $V_{SE}$ of the sense emitter SE in the ON state where $V_{CE}$ is lower than $V_{GE}$ is the value of $V_{SE}$ that is obtained by simultaneous equations of $I_{SE}=f(V_G-V_{SE}-V_{TH}(T))$ and $V_{SE}=R_S \cdot I_{SE}$. $V_{CE}$ is the collector-emitter voltage of the power transistor Tr1, $V_{GE}$ is the gate-emitter voltage of the power transistor Tr1, $V_{TH}$ is a threshold voltage of the power transistor Tr1, which is a function of temperature (T), $I_{SE}$ is a current flowing through the sense emitter, f(V) is a function with a voltage V as a parameter, and $R_S$ is a resistance value of the shunt resistor. The threshold voltage $V_{TH}$ depends on the junction temperature $T_J$ of the power transistor Tr1 (the threshold voltage $V_{TH}$ decreases as the junction temperature $T_J$ increases). Accordingly, the threshold voltage $V_{TH}$ is estimated by comparing the voltage of the sense emitter SE and the gate voltage VG at this time, and the junction temperature $T_J$ can be estimated from the estimation value of the threshold voltage $V_{TH}$.

For example, an operational amplifier AMP3 (second operational amplifier) is placed, where the gate voltage VG of the sense transistor Tr2 (which is the same voltage as the gate voltage of the power transistor Tr1) is supplied to one input of the operational amplifier AMP3, and the emitter voltage SE of the sense transistor Tr2 is supplied to the other input. Specifically, the sense emitter SE is connected to the inverting input terminal of the operational amplifier AMP3 through a resistor R21, the gate of the sense transistor Tr2 is connected to the non-inverting input terminal of the operational amplifier AMP3 through a resistor R22, and a resistor R23 is placed between the non-inverting input terminal of the operational amplifier AMP3 and the ground potential. Further, the output terminal and the inverting input terminal of the operational amplifier AMP3 are connected using a resistor R24. In this configuration, the operational amplifier AMP3 can output a voltage corresponding to a difference between the gate voltage VG of the sense transistor Tr and the emitter voltage SE of the sense transistor Tr2 as temperature information of the power transistor Tr1.

Further, in the case where a resistor $R_{SE}$ is placed between the sense emitter SE and the ground potential (the resistor $R_{SE}$ can be omitted), a measurement result depending on the junction temperature $T_J$ of the power transistor Tr1 is obtained. FIG. 8 is an example of actual measurement the temperature dependence of the relationship between a current flowing through the emitter and a current flowing through the sense emitter in the state where the resistor $R_{SE}$ is placed between the sense emitter SE and the ground potential, $V_{CE}$ is lower than $V_{GE}$, and the adjustment transistor Tr3 is OFF. In this case, the junction temperature $T_J$ can be estimated by comparing a measurement result dependent on the junction temperature $T_J$ (which is a current value of the sense emitter SE when the adjustment transistor Tr3 is OFF) and a measurement result not dependent on the junction temperature $T_J$ (which is a current value of the sense emitter SE when the output terminal of the operational amplifier AMP1 is connected to the gate of the adjustment transistor Tr3).

A current flowing through the sense emitter SE corresponds to a voltage of the node N1. Accordingly, the temperature of the power transistor Tr1 can be estimated using a voltage of the node N1 in the state where the output terminal of the operational amplifier AMP1 is connected to the gate of the adjustment transistor Tr3 and a voltage of the node N1 in the case where the adjustment transistor Tr3 is OFF.

For example, an operational amplifier AMP4 is placed, where the inverting input terminal of the operational amplifier AMP4 and the node N1 are connected through a resistor R26, and the non-inverting input terminal of the operational amplifier AMP4 is connected to the ground potential. Further, the output terminal and the inverting input terminal of the operational amplifier AMP4 are connected through a resistor R27. In this configuration, the operational amplifier AMP4 outputs a voltage corresponding to the voltage of the node N1.

Figure 6:
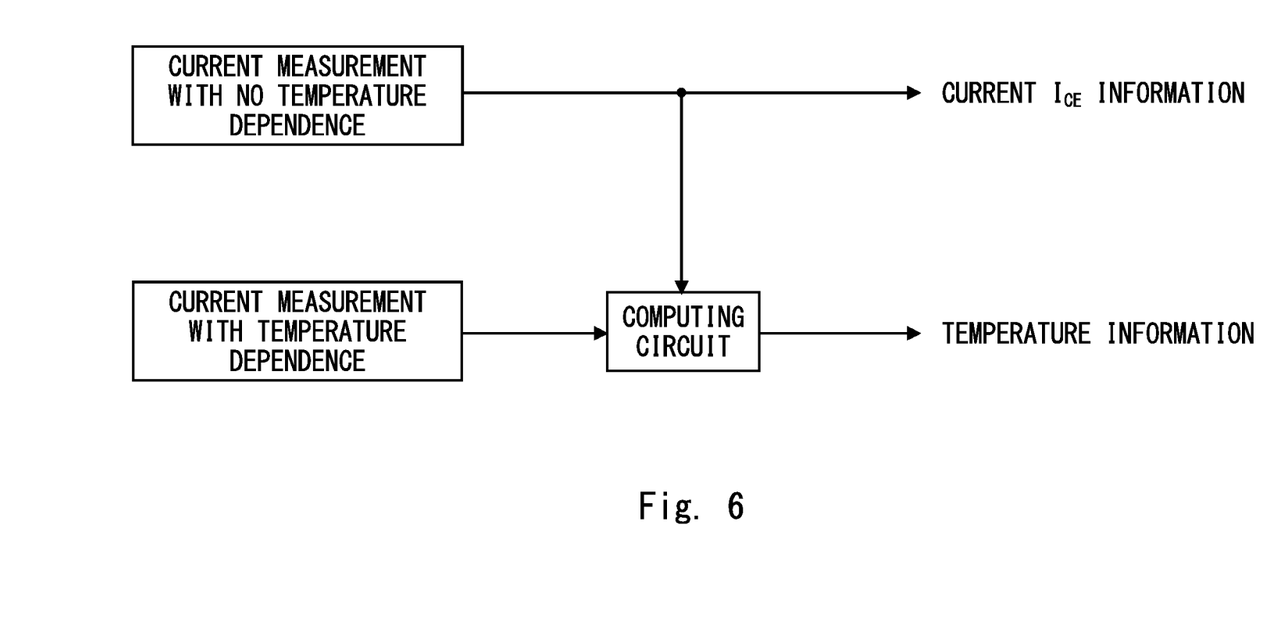
FIG. 6 is a diagram illustrating an operating state of the semiconductor device according to the third embodiment.

In the case where the gate of the adjustment transistor Tr3 is connected to the output terminal of the operational amplifier AMP1, the operational amplifier AMP1 performs feedback control so that the voltage of the sense emitter SE equals the voltage of the Kelvin emitter KE. Thus, in this case, the operational amplifier AMP4 outputs a voltage that does not depend on the junction temperature $T_J$ of the power transistor Tr1. On the other hand, when the voltage Vss is supplied to the gate of the adjustment transistor Tr3, because the adjustment transistor Tr3 is OFF, the operational amplifier AMP4 outputs a voltage that depends on the junction temperature $T_J$ of the power transistor Tr1. In this case, the voltage of the sense emitter SE is a voltage that is lower than the gate-emitter voltage $V_{GE}$ by the threshold voltage $V_{TH}$ of the power transistor Tr1 under the condition that $V_{CE}$ is sufficiently higher than $V_{GE}$ and $V_{GE}$ is higher than $V_{TH}$, and it is a more complicated function of temperature under the condition that $V_{CE}$ is lower than $V_{GE}$. Accordingly, the output voltage of the operational amplifier AMP4 is also a value corresponding to the value that is lower by the threshold voltage $V_{TH}$ FIG. 6 is a diagram illustrating the operating state of the semiconductor device 3 according to this embodiment. As shown in FIG. 6, when the gate of the adjustment transistor Tr3 is connected to the output terminal of the operational amplifier AMP1, current measurement (measurement of a sense emitter current) with no temperature dependence can be performed, and therefore this current information can be used as a measurement result of the emitter voltage $I_{CE}$ of the power transistor Tr1.

On the other hand, when the voltage Vss is supplied to the gate of the adjustment transistor Tr3, the adjustment transistor Tr3 is OFF, and therefore current measurement (measurement of a sense emitter current) with temperature dependence is performed. In this case, the temperature information of the junction can be obtained by performing calculation (division) using a current measurement result with no temperature dependence and a current measurement result with temperature dependence in a computing circuit.

Further, as shown in FIG. 5, the drive circuit 31 includes signal conversion circuits 32_1 and 32_2, isolators 33_1 to 33_3, a temperature abnormality detection circuit 34, a current abnormality detection circuit 35, and a gate driver 36.

The output voltage of the operational amplifier AMP3 is supplied to the temperature abnormality detection circuit 34. The output voltage of the operational amplifier AMP3 is a voltage corresponding to a difference between the gate voltage VG of the sense transistor Tr2 and the emitter voltage SE of the sense transistor Tr, and this voltage corresponds to the temperature information of the power transistor Tr1. When the output voltage of the operational amplifier AMP3 indicates abnormality (for example, when the output voltage of the operational amplifier AMP3 is higher than a specified value), the temperature abnormality detection circuit 34 detects temperature abnormality of the power transistor Tr1 and notifies temperature abnormality to the gate driver 36. When temperature abnormality is notified from the temperature abnormality detection circuit 34, the gate driver 36 sets the gate of the power transistor Tr1 to LOW level to turn the power transistor Tr1 OFF.

The output voltage (temperature information) of the operational amplifier AMP3 is supplied to MCU (Micro Control Unit) through the signal conversion circuit 32_1 and the isolator 33_1. In the case where the drive circuit 31 and the MCU operate in different power supply domains (power supply systems with different reference potentials such as GND), it is preferred to exchange signals between them through the isolator 33_1. Because the isolator is used for transmission of a digital signal, a voltage value that is detected as an analog signal is converted into a digital signal by the signal conversion circuit 32_1 and then output to the MCU through the isolator 33_1. For the conversion into a digital signal, a ΔΣ modulator, a pulse width modulation (PWM) circuit, an A/D converter or the like can be used, for example. The isolator 33_1 exchanges signals in the electrically insulated state using optical coupling by a photocoupler or the like, magnetic coupling by a coil, a magnetoresistive element or the like, electrostatic coupling by a parallel plate capacitor or the like and the like.

The output voltage of the operational amplifier AMP4 is supplied to the current abnormality detection circuit 35. The output voltage of the operational amplifier AMP4 corresponds to a voltage of the node N1, and the voltage of the node N1 corresponds to current information flowing through the power transistor Tr1. When the output voltage of the operational amplifier AMP4 indicates abnormality (for example, when the output voltage of the operational amplifier AMP4 is lower than a specified value), the current abnormality detection circuit 35 detects that an overcurrent is flowing to the power transistor Tr1 and notifies current abnormality to the gate driver 36. When current abnormality is notified from the current abnormality detection circuit 35, the gate driver 36 sets the gate of the power transistor Tr1 to LOW level to turn the power transistor Tr1 OFF.

Further, the current abnormality detection circuit 35 can operate also as a temperature abnormality detection circuit. Specifically, the current abnormality detection circuit 35 estimates the temperature of the power transistor Tr1 by using the output voltage of the operational amplifier AMP4 in the state where the output terminal of the operational amplifier AMP1 is connected to the gate of the adjustment transistor Tr3 and the output voltage of the operational amplifier AMP4 in the case where the adjustment transistor Tr3 is OFF. Then, when the estimated temperature value is larger than a specified value, it detects that the temperature of the power transistor Tr1 is abnormal and notifies temperature abnormality to the gate driver 36.

The output voltage (current information) of the operational amplifier AMP4 is supplied to MCU (Micro Control Unit) through the signal conversion circuit 32_2 and the isolator 33_2. Further, a signal from the MCU is supplied to the gate driver 36 through the isolator 33_3. Note that the configuration of the signal conversion circuit 32_2 is the same as that of the signal conversion circuit 32_1, and the configuration of the isolators 33_2 and 33_3 is the same as that of the isolator 33_1.

As described above, in the semiconductor device 3 according to this embodiment, by switching between the case where the output of the operational amplifier AMP1 is supplied to the gate of the adjustment transistor Tr3 and the case where the voltage Vss for turning the adjustment transistor Tr3 OFF is supplied to the gate of the adjustment transistor Tr3, it is possible to estimate the junction temperature of the power transistor Tr1. This eliminates the need to include a diode for temperature detection in the power transistor circuit 11.

Further, because a diode for temperature detection is often formed in a polysilicon layer which is different from a diffusion layer of the power transistor circuit 11, there are large variations in characteristics and the measured temperature is different from the temperature of the diffusion layer in some cases. On the other hand, in the semiconductor device 3 according to this embodiment, because the junction temperature is estimated using the temperature characteristics of the power transistor Tr1 itself, it is possible to accurately measure the temperature of the power transistor Tr1.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit configured to drive a gate of an external power transistor, the semiconductor integrated circuit comprising:
   a first terminal configured to input a first voltage of an emitter of the external power transistor;
   a second terminal configured to input a second voltage of a sense emitter of the external power transistor;
   a third terminal configured to input a sense voltage corresponding to a current flow through the sense emitter of the external power transistor;
   a fourth terminal configured to output a feedback voltage based on the difference between the first voltage and the second voltage;
   a fifth terminal configured to output a driving voltage to the gate of the external power transistor;
   a driver circuit configured to generate the driving voltage; and
   a protection circuit configured to turn down the driving voltage based on the sense voltage.

2. The semiconductor integrated circuit according to claim 1, further comprising:
   a comparator configured to compare the first voltage and the second voltage and generate the feedback voltage based on the comparison result.

3. The semiconductor integrated circuit according to claim 2,
   wherein the fourth terminal is coupled to a path of the current flow of the sense emitter of the external power transistor, and
   wherein the comparator equalizes voltage levels of the first voltage and the second voltage by controlling the feedback voltage.

4. The semiconductor integrated circuit according to claim 3,
   wherein the fourth terminal is coupled to a gate of an external adjustment transistor, and
   wherein the path of the current flow of the sense emitter of the external power transistor includes a source and a drain of the external adjustment transistor.

5. The semiconductor integrated circuit according to claim 1, wherein the external power transistor is external to the integrated semiconductor circuit.

6. The semiconductor integrated circuit according to claim 1, wherein the protection circuit is further configured to turn off the drive voltage based on the sense voltage.

7. The semiconductor integrated circuit according to claim 1, wherein the sense voltage is different from first voltage and the second voltage.

8. An integrated driver circuit comprising:
   a first terminal configured to receive a first voltage of an emitter of a power transistor external to the integrated driver circuit;
   a second terminal configured to receive a second voltage of a sense emitter of the power transistor;

a third terminal configured to receive a third voltage based on a current flow through the sense emitter of the power transistor, the third voltage being different from the second voltage;

a fourth terminal configured to output a feedback voltage based on the difference between the first voltage and the second voltage;

a driver circuit configured to generate a driving voltage based on the third voltage; and a fifth terminal configured to output the driving voltage to a gate of the power transistor.

9. The integrated driver circuit according to claim 8, further comprising:

a protection circuit configured to control the driver circuit to turn down the drive voltage based on the third voltage.

10. The integrated driver circuit according to claim 9, wherein the protection circuit is further configured to control the driver circuit to turn off the drive voltage based on the sense voltage.

* * * * *